(12) United States Patent
Dernier

(10) Patent No.: US 10,004,150 B2
(45) Date of Patent: Jun. 19, 2018

(54) VERTICAL ELECTRONIC DEVICE AND MODULAR UNIT

(71) Applicant: THOMSON LICENSING, Issy les Moulineaux (FR)

(72) Inventor: William Phillip Dernier, Indianapolis, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days. days.

(21) Appl. No.: 15/308,251

(22) PCT Filed: Mar. 31, 2015

(86) PCT No.: PCT/US2015/023488
§ 371 (c)(1),
(2) Date: Nov. 1, 2016

(87) PCT Pub. No.: WO2015/171218
PCT Pub. Date: Nov. 12, 2015

(65) Prior Publication Data
US 2017/0064843 A1  Mar. 2, 2017

Related U.S. Application Data

(60) Provisional application No. 61/989,828, filed on May 7, 2014.

(51) Int. Cl.
*H05K 7/00* (2006.01)
*H05K 5/00* (2006.01)
(Continued)

(52) U.S. Cl.
CPC ......... *H05K 5/0013* (2013.01); *H05K 5/0021* (2013.01); *H05K 5/0217* (2013.01);
(Continued)

(58) Field of Classification Search
CPC .. H05K 5/0013; H05K 5/0021; H05K 5/0217; H05K 5/0221; H05K 5/0226; H05K 5/0247; H05K 5/03
(Continued)

(56) References Cited

U.S. PATENT DOCUMENTS 3,967,303 A * 6/1976 Fischer ................ G03B 17/561
396/198
3,969,796 A * 7/1976 Hodsdon ............. H01M 2/1022
24/270
(Continued)

FOREIGN PATENT DOCUMENTS

WO  WO2014058620 A1  4/2014

OTHER PUBLICATIONS

Pitwon, et al; "An Optical Backplane Connection System with Pluggable Active Board Interfaces;" Circuit World 33.4; Oct. 2007.

*Primary Examiner* — Hung S Bui
(74) *Attorney, Agent, or Firm* — Richard Laperuta; Jerome G. Schaefer

(57) ABSTRACT

An electronic device system is provided that comprises: a vertically oriented set top box having an outer casing that includes a wall; and an electronic modular component connected to the wall. The wall comprises: at least one connector aperture; latch catch; and an electronic jack between the at least one connector aperture and the latch catch. The modular component comprises: at least one connector that engages the at least one connector aperture; a latch engages the latch catch to connect the electronic modular component to the wall of the electronic device; and an electronic connector that engages the electronic jack when the latch is engaged.

9 Claims, 26 Drawing Sheets

(51) Int. Cl.
  *H05K 5/02* (2006.01)
  *H05K 5/03* (2006.01)
(52) U.S. Cl.
  CPC ......... *H05K 5/0221* (2013.01); *H05K 5/0226* (2013.01); *H05K 5/0247* (2013.01); *H05K 5/03* (2013.01)
(58) Field of Classification Search
  USPC ........................................................ 361/747
  See application file for complete search history.

(56) References Cited

U.S. PATENT DOCUMENTS

| | | | | |
|---|---|---|---|---|
| 4,709,974 | A | * | 12/1987 | Hawkins ............. H01M 2/1022 439/341 |
| 5,257,163 | A | * | 10/1993 | Buist .................... G06F 1/18 361/679.22 |
| 5,398,162 | A | * | 3/1995 | Bice .................... H05K 7/1409 292/209 |
| 5,666,264 | A | | 9/1997 | Chandler et al. |
| 6,853,549 | B2 | | 2/2005 | Xu |
| 6,934,162 | B2 | | 8/2005 | Perez et al. |
| 7,091,413 | B2 | | 8/2006 | Mukougawa |
| 7,633,743 | B2 | | 12/2009 | Barton et al. |
| 8,128,422 | B2 | * | 3/2012 | Mellott .............. H01R 13/2421 439/180 |
| 2012/0243176 | A1 | | 9/2012 | Ritter et al. |
| 2012/0300966 | A1 | * | 11/2012 | Stewart, Jr. ............ H04R 1/026 381/332 |

* cited by examiner

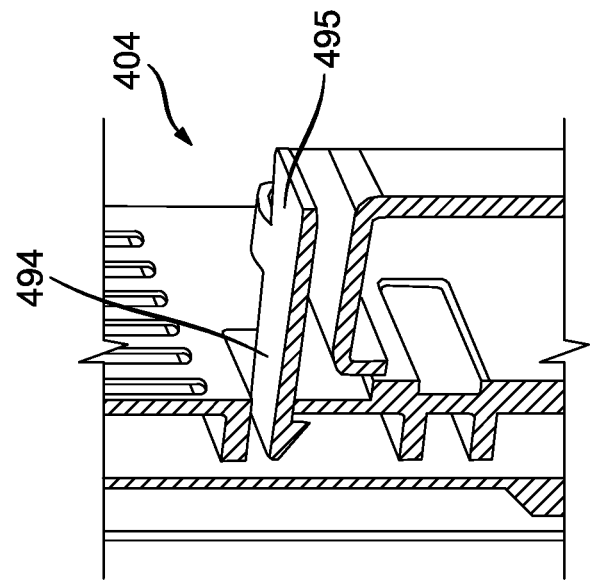
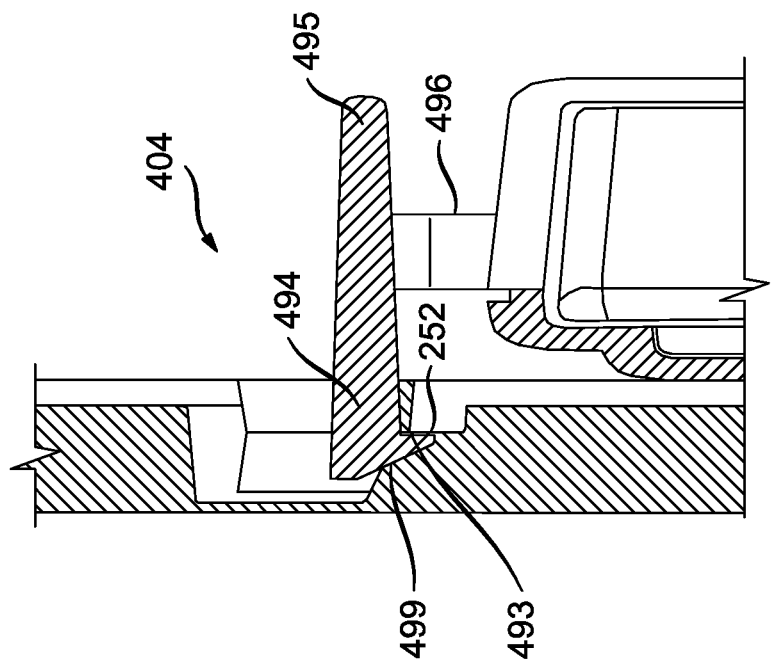

us 10,004,150 B2

VERTICAL ELECTRONIC DEVICE AND MODULAR UNIT

CROSS-REFERENCE TO RELATED APPLICATIONS

This application claims the benefit, under 35 U.S.C. § 365 of International Application PCT/US2015/023488 filed Mar. 31, 2015, which was published in accordance with PCT Article 21(2) on Nov. 12, 2015 in English and which claims the benefit of U.S. provisional patent application No. 61/989,828 filed May 7, 2014. The provisional and PCT applications are expressly incorporated by reference herein in their entirety for all purposes.

TECHNICAL FIELD

The present principles relate to a modular unit and an electronic apparatus adapted to be customized with a modular unit.

BACKGROUND

Electronic apparatuses or devices such as set-top boxes are typically assembled apparatuses having a plurality of walls wherein at least one of the walls is secured with a plurality of screws. Unfortunately, gaining access to the interior components of these devices requires removing the plurality of screws which often requires excessive handling of the device. The excessive handling often will involve changing the orientation of the device, such as by turning the devices upside down or placing it on its sides, to find each of the screws. This is then followed by disassembling the device by removal of one screw at a time with the device being upside down or on its side. This excessive handling of the device increases the chances of damaging the interior components because each motion of the device jars the components. Interior components will typically include one or more printed circuit boards and components thereon which can be at risk of damage. Additionally, the removal and reengaging of the screws presents the opportunity for scratching the device or stripping threads of the screws.

In light of the fact that interior components of electronic devices often need to be accessed and that accessing the interior components can place the interior components at risk of damage or place the electronic device at risk for scratches, a need exists for an improved electronic device structure and method for opening the electronic device which is fast, simple, and safe and a need exists to introduce different functionalities to the electronic device which is also fast, simple, and safe without having to open the electronic device.

To meet some of the known needs, one known system is disclosed in WO2010008360A1. FIG. 1 is a perspective view of the apparatus according to WO2010008360A1 in a disassembled condition. An apparatus 1, such as a set top box, can include an enclosure having exterior walls defining an interior space, a top 10 having an interior surface 112 and a plurality of coupling clips 30 extending from the interior surface, and a base 5. The base 5 has an inner surface, a plurality of clip receiving members 20 extending from the inner surface which engage the coupling clips 30 to secure the top 10 to the base 5. The base 5 further includes at least one aperture 7 adapted to permit a release fixture having a plurality of decoupling members extending from a plate to simultaneously disengage the clip receiving members 20.

Further, there is a recognized need in the market to reduce the sizes of set top boxes without reducing the plurality of functionalities, versatility and ability to increase their functionalities. As a consequence, there is a need for set top boxes to be designed to be more crowded in terms of the interior components and/or to be adaptable in such a fashion where additional functionalities and components can be introduced without accessing the interior of set top boxes.

Because more densely packed set top boxes implies a more frequent need to access the interiors of such set top boxes, set top boxes need to be designed in such a fashion that they can be safely and quickly disassembled. This will prevent excessive handling when adding other interior components and/or replacing damaged or antiquated interior components with new or improved components.

Because of spatial constraints in more densely packed set top boxes and/or the convenience of being able add one or more functionalities without the need to gain interior access to set top boxes, it would be advantageous to develop set top boxes in such a fashion that users are able to change or enhance the functionalities of set top boxes by adapting set top boxes to able to receive modular components by someone that does not have professional installation skills.

The need for electronic devices such as set top boxes and gateway devices, to have screwless design and/or to be adaptable to receive functionalities through modular components also applies to vertically oriented electronic devices in which the casings of the device are vertically tall or at least less horizontally oriented than the device shown in WO2010008360A1. Because vertically oriented electronic devices appear to be of interest in the consumer market, some focus of the current principles applies to vertically oriented electronic devices.

SUMMARY

These and other drawbacks and disadvantages of the prior art are addressed by the present principles, which are directed to an external module component for an electronic apparatus and an electronic apparatus adapted to receive such an external module component.

According to an aspect of the present principles, at least one vertical wall of an electronic device is adapted to receive, hold and function with an external modular component that is easily attached and detached from the one vertical wall. The device is adapted to receive a modular component 400. The component includes at least one mechanical connector (405); a latch (404) that engages the latch catch to connect the external modular component to the wall of the electronic device; and an electronic connector (402) that engages an electronic jack when the latch is engaged.

According to another aspect of the present principles, an electronic device system (200, 400) is provided that comprises: an electronic device (200) having an outer casing that includes a wall (206); and an electronic modular component (400) connected to the wall. The wall can include at least one connector aperture (250); a latch catch (252); and an electronic jack (251) between the at least one connector aperture and the latch catch. The modular component can include at least one connector (405) that engages the at least one connector aperture; a latch (404) that engages the latch catch to connect the electronic modular component to the wall of the electronic device; and an electronic connector (402) that engages the electronic jack when the latch is engaged. The at least one connector can be a hook positioned adjacent a lower edge of a side (401) of the electronic modular component in which the hook creates a hinge when engaged in the at least one connector aperture. The latch can be positioned adjacent an upper edge of the side and the latch can comprise a planar portion perpendicular to the side and extending away from the side in which the planar portion has a leading edge (494) having a protruding angled portion (499) which grasps the latch catch, thereby causing the latch to engage the latch catch. The latch can include a latch hinge (496) to which the planar portion is connected in which the latch hinge is attached to the electronic modular component and the latch hinge permits the planar portion to rotate about an attachment point such that when an exterior angled portion of the protruding angled portion contacts an exterior region of the latch catch of the electronic device and is pushed toward the electronic device and such that the exterior angled portion causes the leading edge of the planar portion to rotate to an extent where the leading edge is laterally positioned so the leading edge and the protruding angled portion enters the latch catch, whereby the planar portion elastically laterally repositions once the leading edge and the protruding angled portion are in the latch catch to cause an interior contact edge (498) opposite the exterior angled portion to grasp an interior edge of the latch catch. The planar portion of the latch can include a trailing portion (495) opposite the leading edge and the trailing portion can be configured to disengage the protruding angled portion from the latch catch when the trailing portion is pressed to enable the electronic modular component to be detached from the electronic device. A wall portion (280) can be connected to the wall (206) and the wall portion can form an obtuse angle with the wall in which the electronic modular component (400) comprises a side (401) facing the wall of the electronic device and a side wall (410) parallel to the wall portion. The electronic device can have a vertical orientation in which the outer casing has a height that is higher than a width of at least one of a front vertical surface of the outer casing, a lateral depth of the outer casing, and a width of the wall that supported the electronic modular component.

According to other aspects of the present principles, an electronic device (200) comprises an outer casing; a wall (206) configured to receive and support an electronic modular component; at least one connector aperture (250) on the wall for receiving at least one connector (405) of the electronic modular component; a latch catch (252) on the wall for engaging a latch (404) of the electronic modular component; and an electronic jack (251) on the wall for connecting to an electronic connector (402) of the electronic modular component; wherein the electronic device comprises a wall portion (280) connected to the wall (206), the wall portion forming an obtuse angle with the wall and the outer casing comprises a case bottom piece (213), a case top front piece (211) and a case top back piece (212) that includes the wall for supporting the electronic modular component.

Additionally, an electronic modular component (400) is provided for connecting to a larger electronic device (200) in which the electronic modular component includes a back broad side (401); at least one connector (405) on the back broad side adjacent one edge of the back broad side, the at least one connector configured to engage at least one connector aperture of the electronic device; a latch (404) positioned at an opposite edge of the back broad side, the latch configured to engage a latch catch (252); and an electronic connector (402) between the latch and the at least one connector on the back broad side in which the electronic connector is configured to engage an electronic jack (252) when the latch is engaged. The electronic modular component can have a top plan view quadrilateral shape in which the back broad side is parallel to a front broad side (403) and two vertical side walls (410) extend between the front and back broad sides. The back broad side can have a smaller lateral width than the lateral width of the front broad side. The latch can include a latch hinge (496) positioned at an end of the electronic modular component; a planar portion connected to the latch hinge, the planar portion extending beyond the lateral position of the back broad side; and a leading edge (494) at one end of the planar portion having an interior contact edge (498) extending from the planar portion at an angle from planar portion, the interior contact edge being configure to grasp an interior edge of the latch catch of the electronic device. The planar portion of the latch can include a trailing portion (495) opposite the leading edge in which the trailing portion is configured to disengage the interior contact edge (498) from the latch catch when the trailing portion is pressed.

BRIEF DESCRIPTION OF THE DRAWINGS

The present principles can be better understood in accordance with the following exemplary figures, in which:

FIGS. 30-34 show other various view of the modular component 400 to be attached and being attached to the vertically oriented electronic device 200, in accordance with an embodiment of the present principles.

DETAILED DESCRIPTION

The present principles are directed to a modular unit and an electronic apparatus adapted to be customized with a modular unit. Modular units can have hard drive functions, processing functions, and memory functions. The modular units can have wire or wireless signal transmission functions to transmit and relay signal and/or instructions into the electronic device.

The present principles have particular applicability to vertically oriented electronic apparatus, because such devices can have large available vertical surface areas to accommodate modular units according the present principles, but the present principles can also be employed in horizontally oriented set top boxes. Further, the present principles have applicability to electronic apparatuses designed to be disassembled with an associated disassembly release tool that can quickly and safely disassemble the electronic apparatus, because the present principles promote the augmentation and/or replacement functionalities and/or components of the electronic device and reduces excessive handling.

Figure 1:
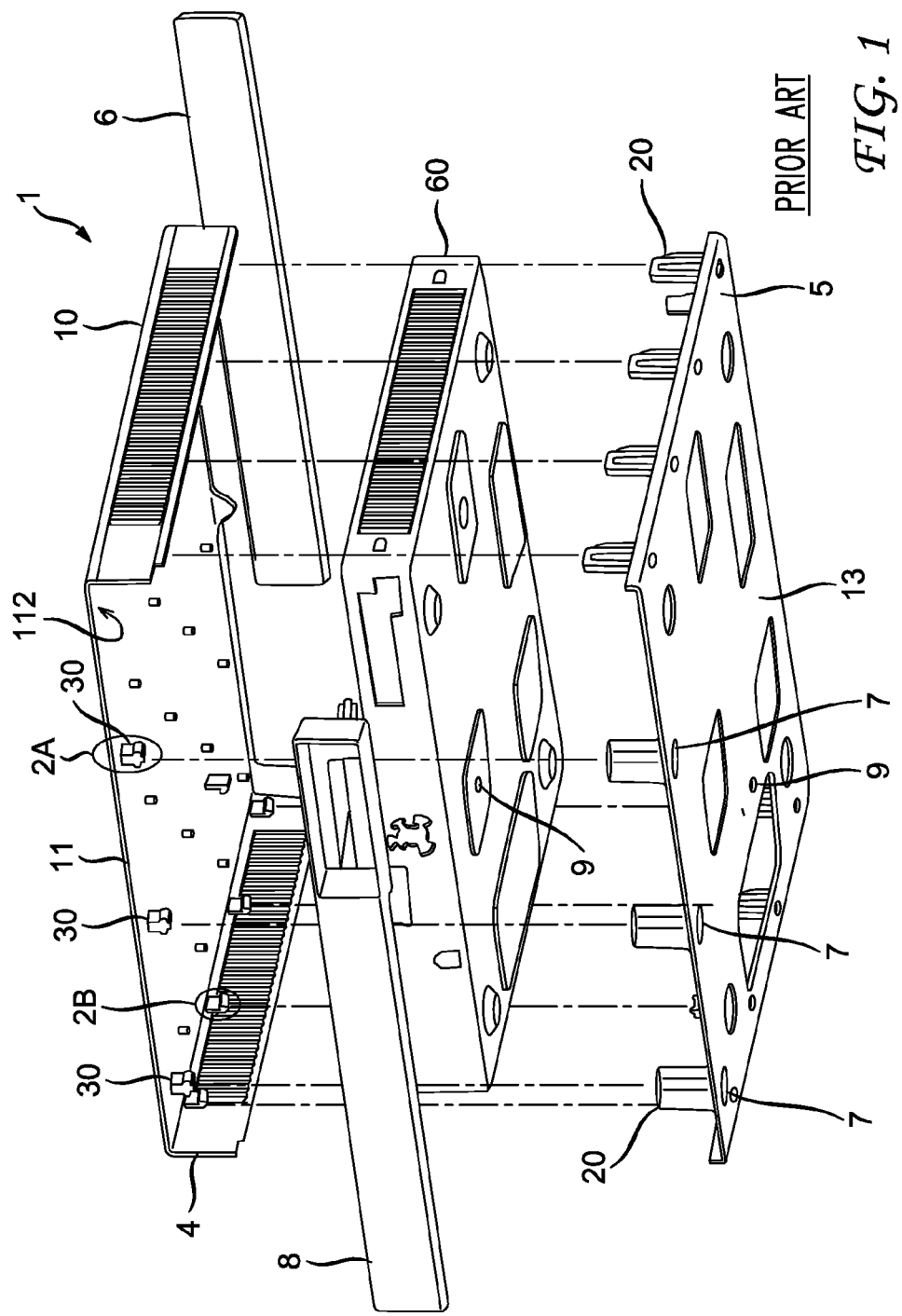
FIG. 1 is a perspective view of a prior art horizontal oriented casing of an electronic device.
Figure 2:
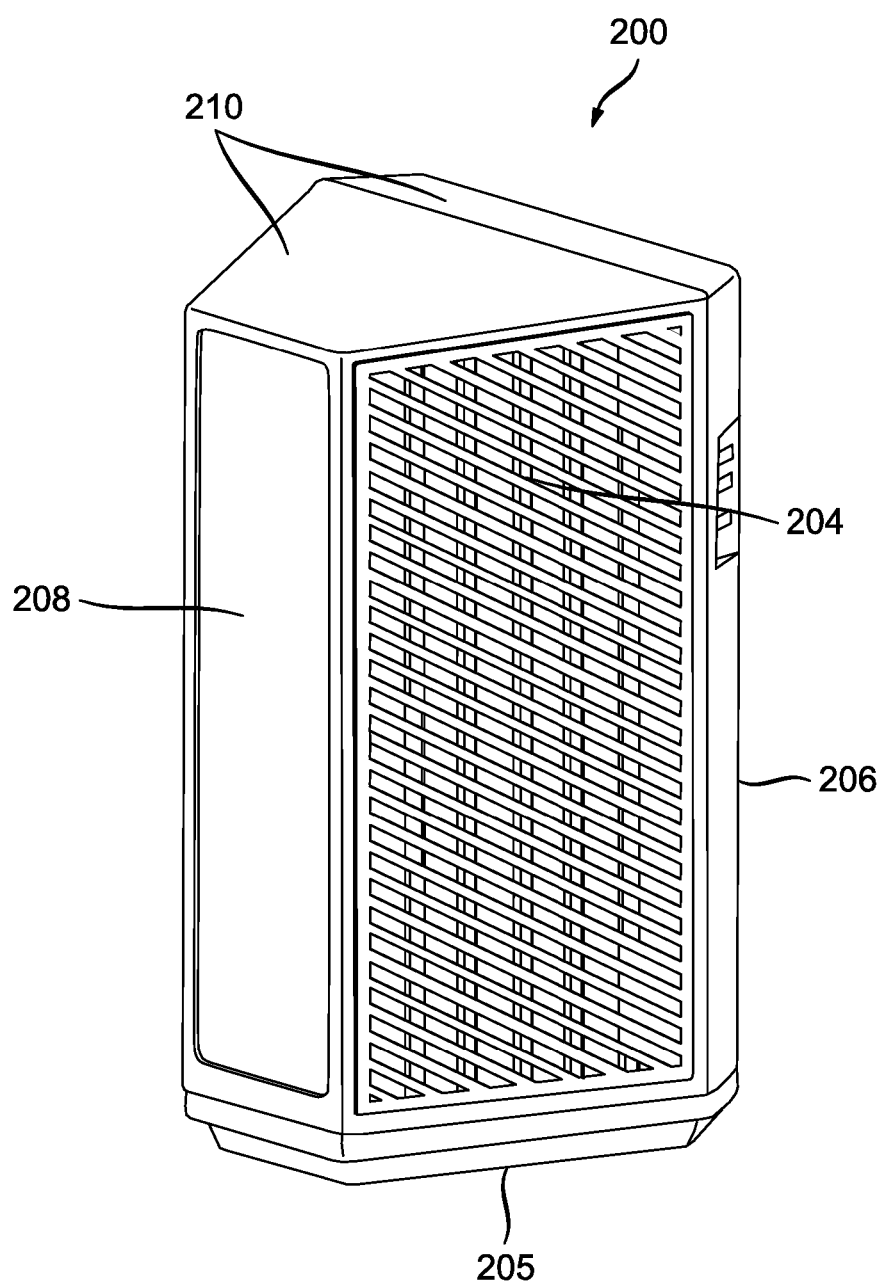
FIG. 2 is a perspective view of a vertically oriented electronic device 200, in accordance with an embodiment of the present principles.

FIG. 2 shows a perspective view of the vertically oriented electronic device 200 having a top 210, a front wall 208, a rear wall 206, side walls 204, and a base 205, in which one of the walls is adapted to receive and accommodate a modular unit accordance with an embodiment of the present principles.

Figure 3:
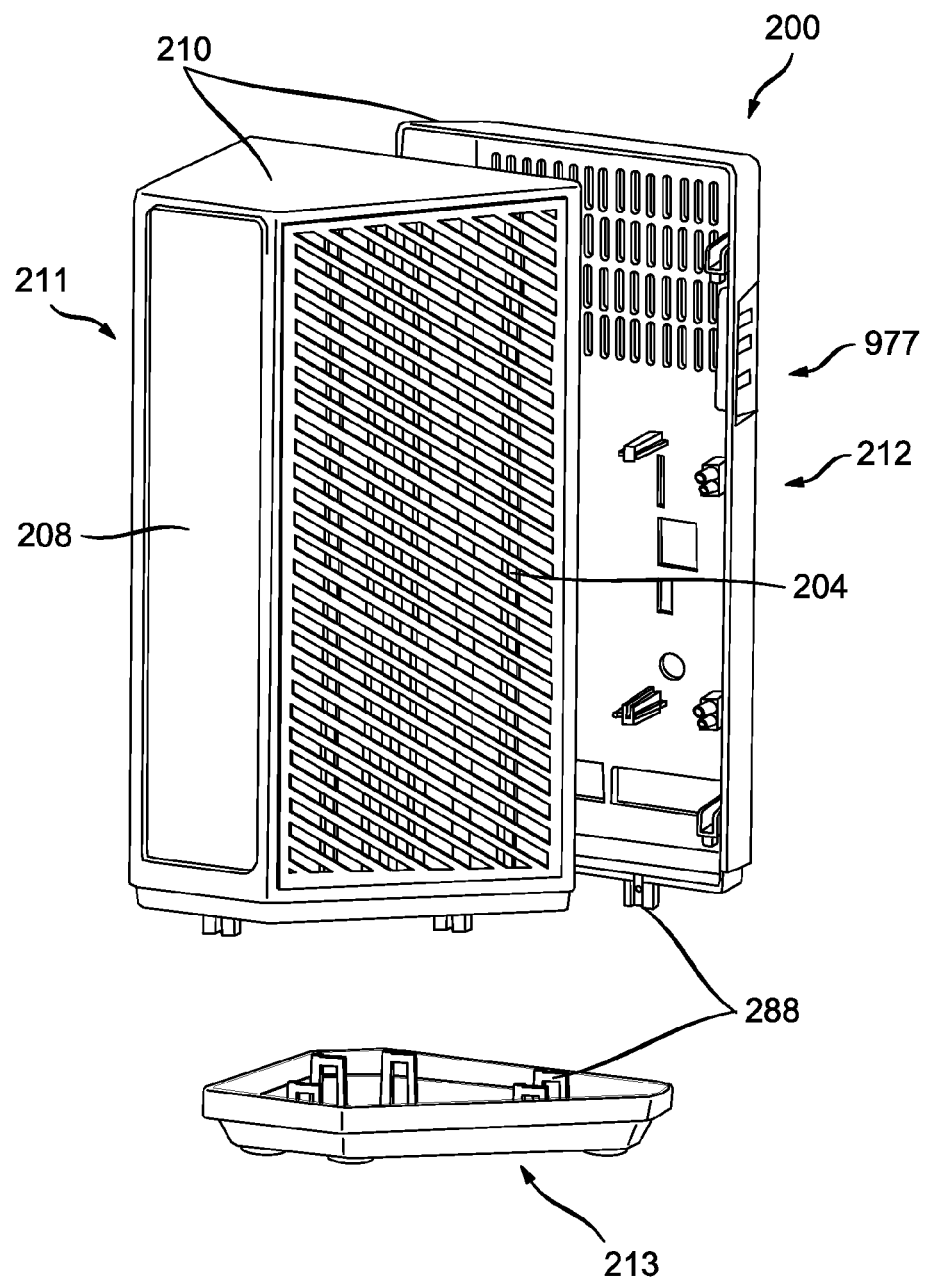
FIG. 3 is a disassembled perspective view of the vertically oriented electronic device 200, in accordance with an embodiment of the present principles.

FIG. 3 shows the three principal pieces of a vertically oriented electronic device 200 that is commensurate with the present principles. The three pieces are the case bottom piece 213, the case top front piece 211, and the case top back piece 212.

Figure 4:
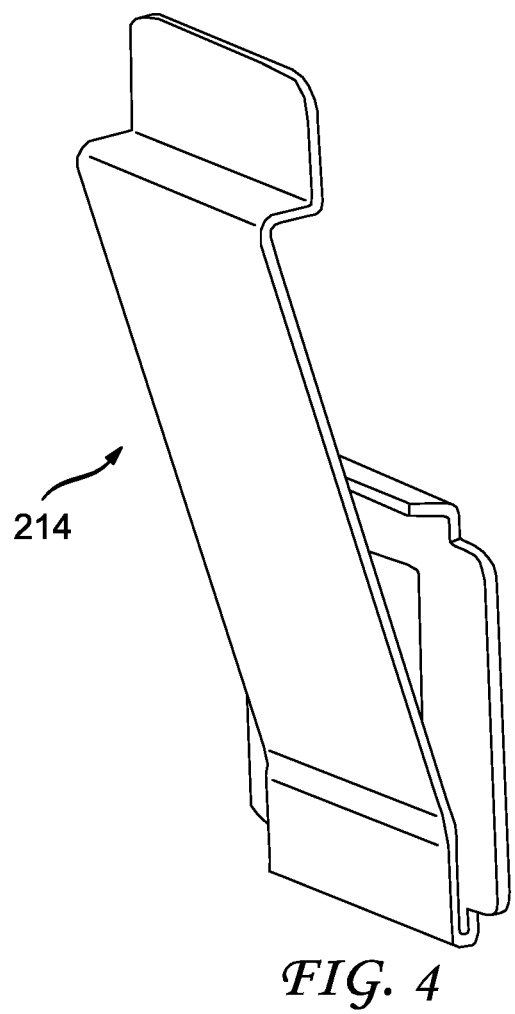
FIG. 4 is a perspective view of a retention clip 214, in accordance with an embodiment of the present principles.

FIG. 4 is a perspective view of a retention clip 214 which can be metal that is utilized to engage and secure the case bottom piece 213 to the case top front piece 211 and/or the case top back piece 212.

Figure 5:
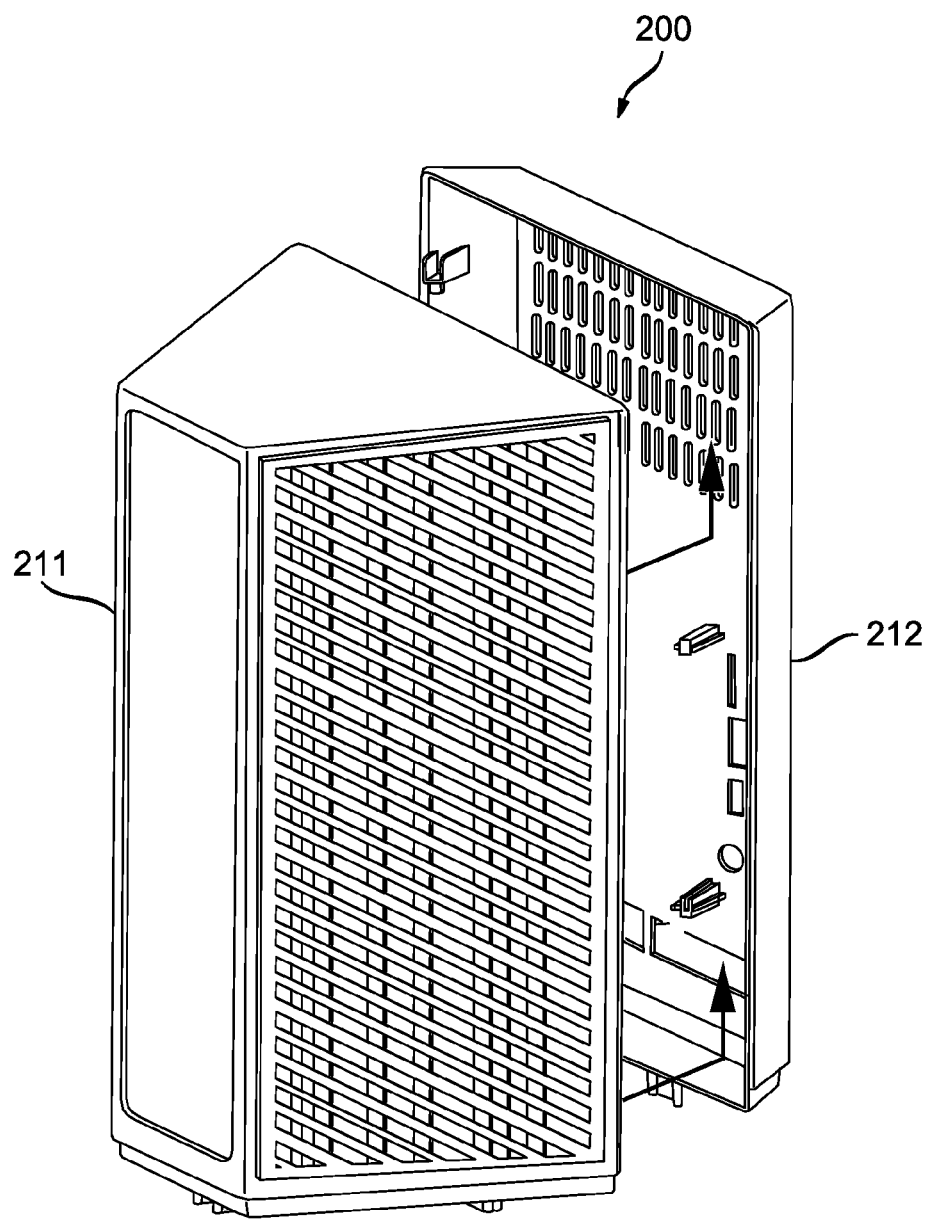
FIG. 5 is a perspective view of the casing that shows how the pieces of the casing are assembled, in accordance with an embodiment of the present principles.
Figure 6:
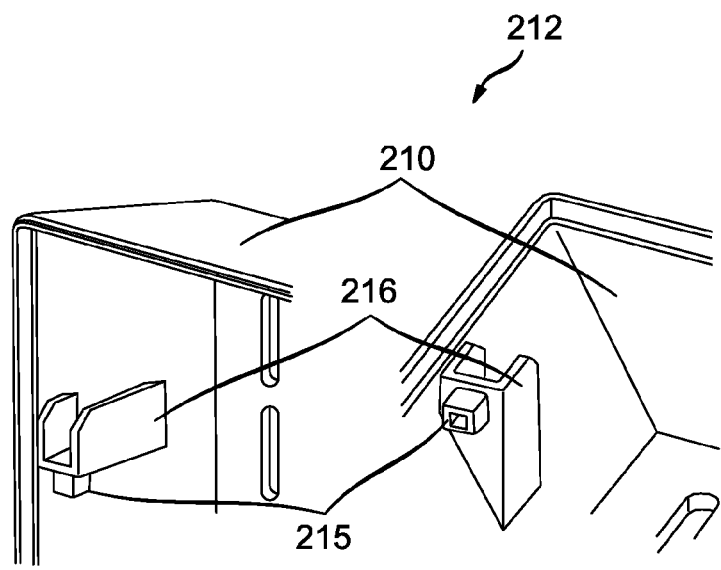
FIG. 6 is a perspective view of the casing that shows a case back retaining feature, in accordance with an embodiment of the present principles.
Figure 7:
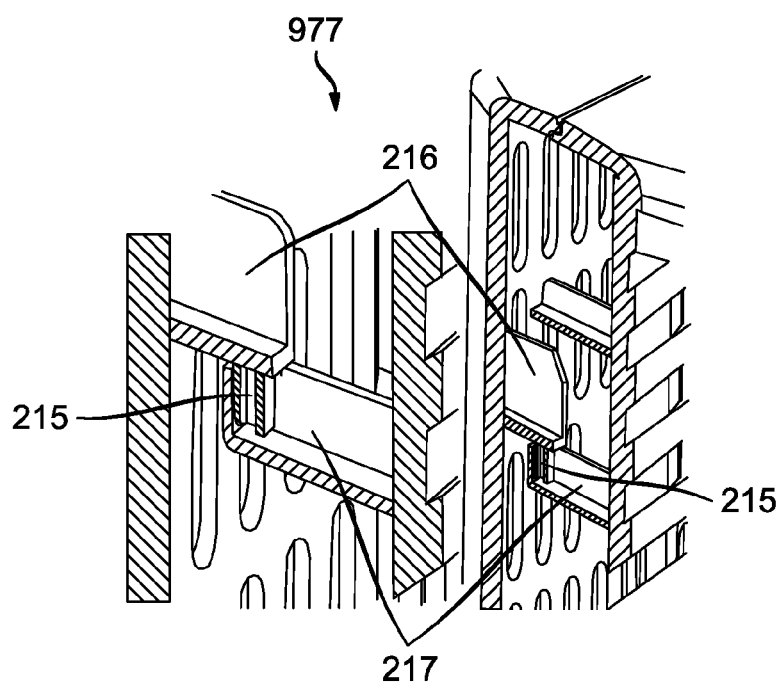
FIG. 7 is a perspective view of the casing that shows a cross-section of an interlock, in accordance with an embodiment of the present principles.
Figure 8:
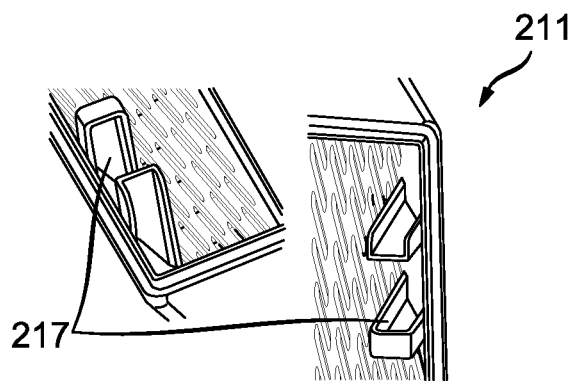
FIG. 8 is a perspective view of the casing that shows an opening on the case front, in accordance with an embodiment of the present principles.

FIG. 5 shows how the case top front piece 211 is slid back onto case top back piece 212 of the electronic device 200, and then up into retaining features in order lock the two together such that internal electronic components can be housed therein when the assembly is finalized. FIGS. 6-8 show the specific engagement mechanism in which a protruding ledge 216 extends inwardly from the interior surface of one of the vertical walls of one of the pieces. The protruding ledge 216 includes protrusions 215 that engage protrusion receiving openings 217 on the case front piece 211. The protrusion receiving openings 217 are generally horizontal ledges that have upstanding peripheral walls to make a slot that can receive the protrusions 215. The slots can be oversized in the dimension that is perpendicular from the interior wall from which the ledge extends or along its long lateral axis. The slot can be narrow along the dimension parallel to the wall or along the ledge's short lateral axis to snuggly fix the protrusions 215. The protruding ledge 216, the protrusions 215, and the protrusion receiving openings 217 form a screwless engagement structure.

Figure 9:
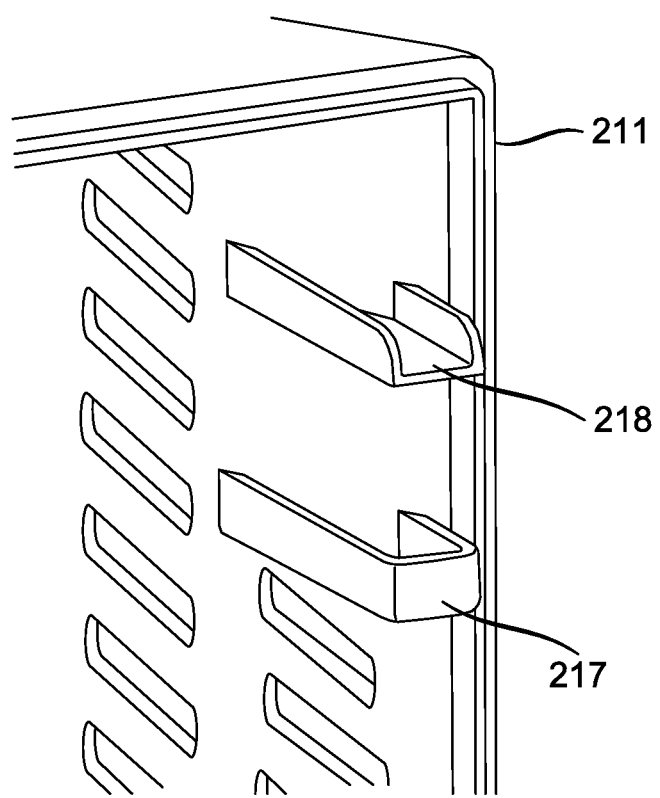
FIG. 9 is a perspective view of the retaining features of the vertically oriented electronic device 200, in accordance with an embodiment of the present principles.
Figure 10:
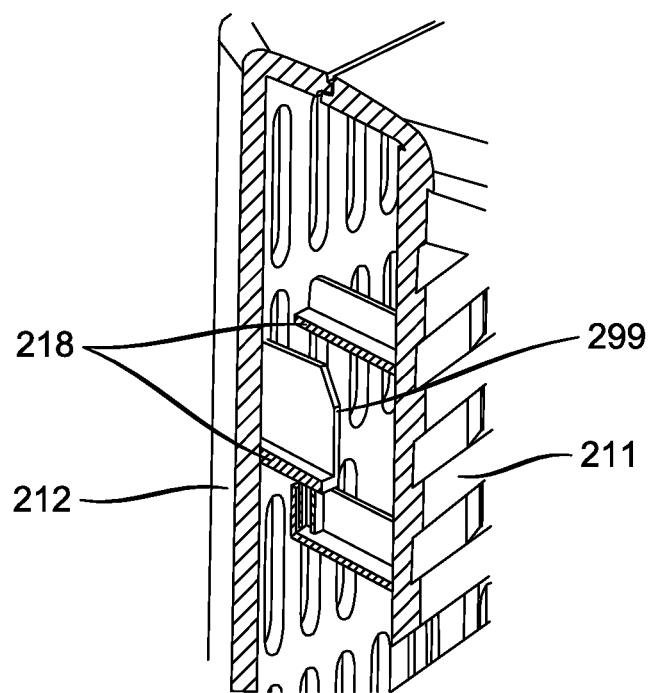
FIG. 10 is another perspective view of the retaining features of the vertically oriented electronic device 200, in accordance with an embodiment of the present principles.

FIGS. 9 and 10 show further perspective views of the retaining features that are used to engage the case top front piece 211 with the case top back piece 212, in accordance with an embodiment of the present principles. FIG. 9 shows ribs 218 that are positioned above the protrusion receiving openings 217 and also extend inwardly from the interior surface of one of the vertical walls of the front piece 211. The ribs 218 would interfere with the case rear retention feature if an assembly start position is attempted that is too low. FIG. 10 shows that a chamfer 299 guides the case top 210 to an acceptable start location. Rib 218 prevents case front from starting in too low of a position by preventing excessive case travel which can damage components.

Figure 11:
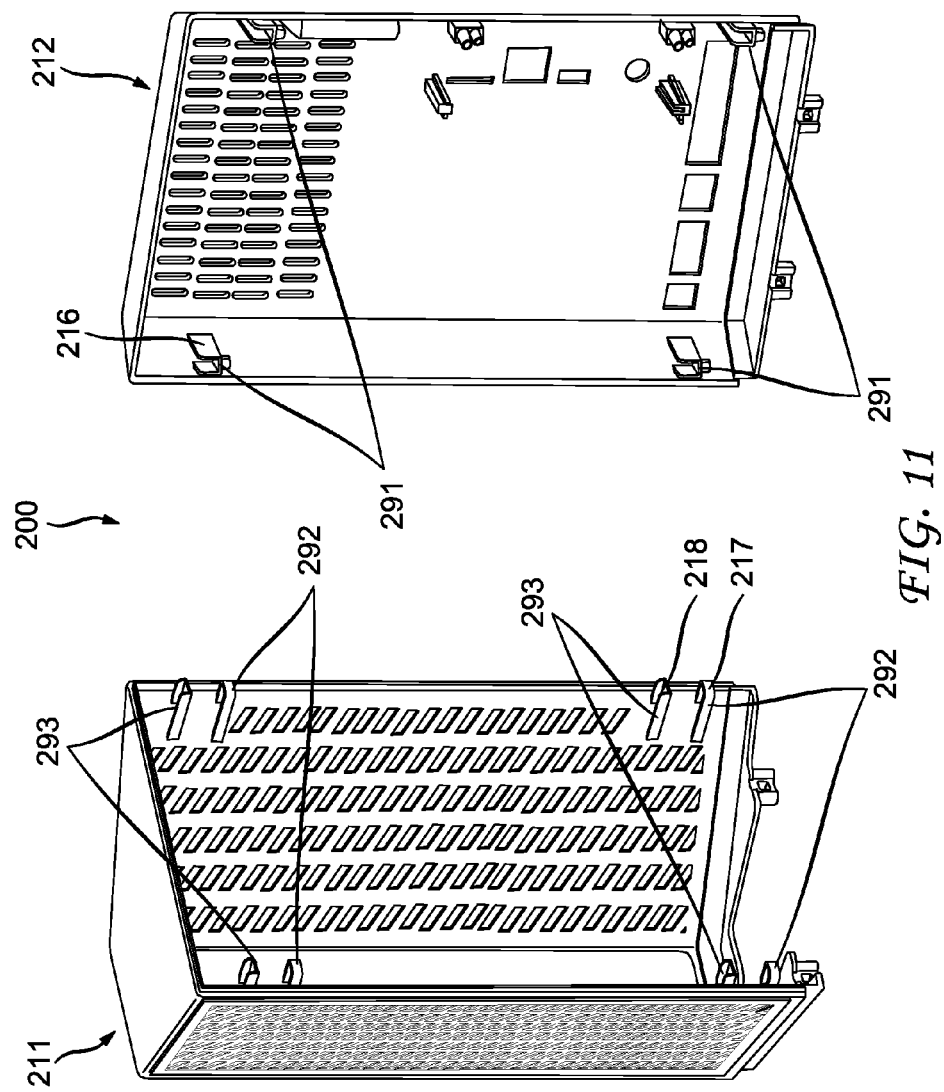
FIG. 11 is a disassembled perspective view of the vertically oriented electronic device 200, in accordance with an embodiment of the present principles.

FIG. 11 is a disassembled perspective view of the vertically oriented electronic device 200 showing the interior walls of the front piece 211 and the case top back piece 212 of the electronic device 200. The retention protrusions 291, the retention openings 292, and over travel prevention portions 293 are shown in FIG. 11.

Figure 12:
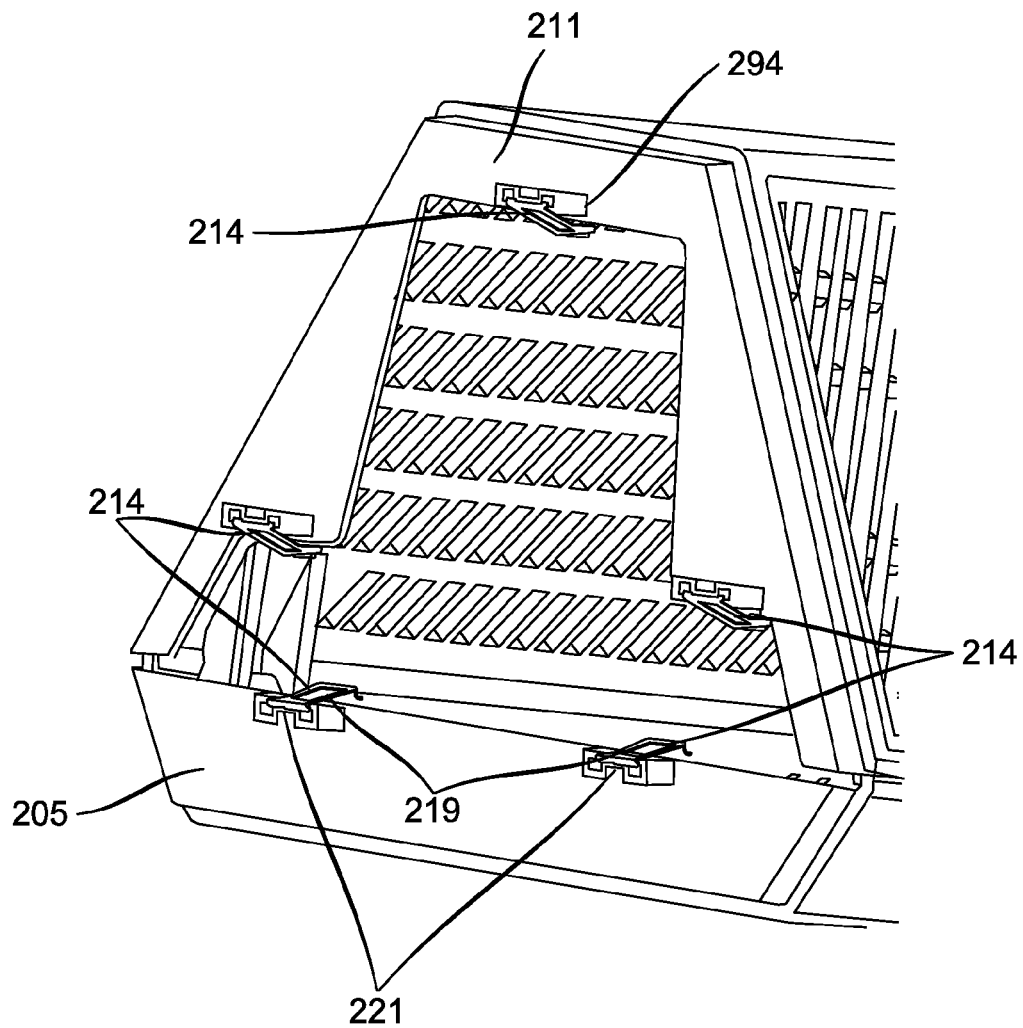
FIG. 12 is a bottom perspective view of the vertically oriented electronic device 200 and the metal retention clips 214, in accordance with an embodiment of the present principles.

FIG. 12 is a bottom perspective view of the vertically oriented electronic device 200 in which the case bottom piece 213 is not attached.

Figure 13:
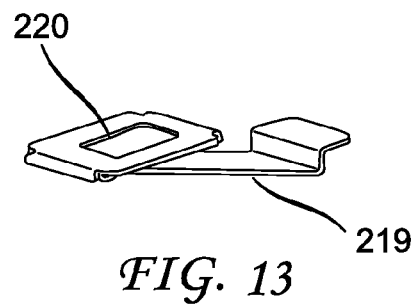
FIGS. 13-15 are various views of the metal retention clips, in accordance with an embodiment of the present principles.
Figure 14:
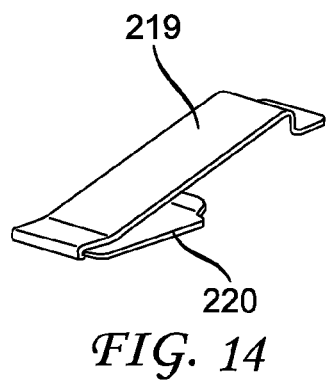
Figure 15:
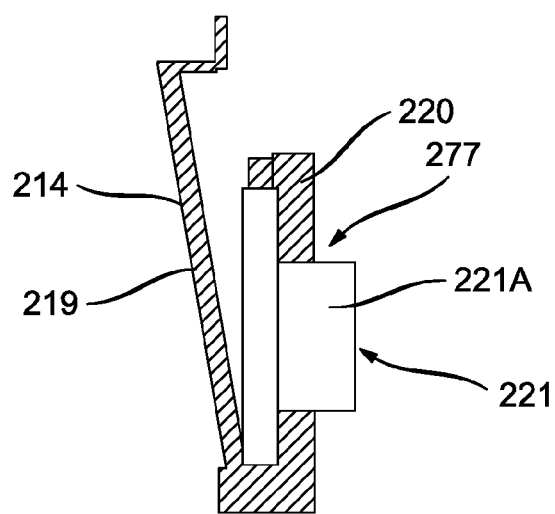
Figure 18:
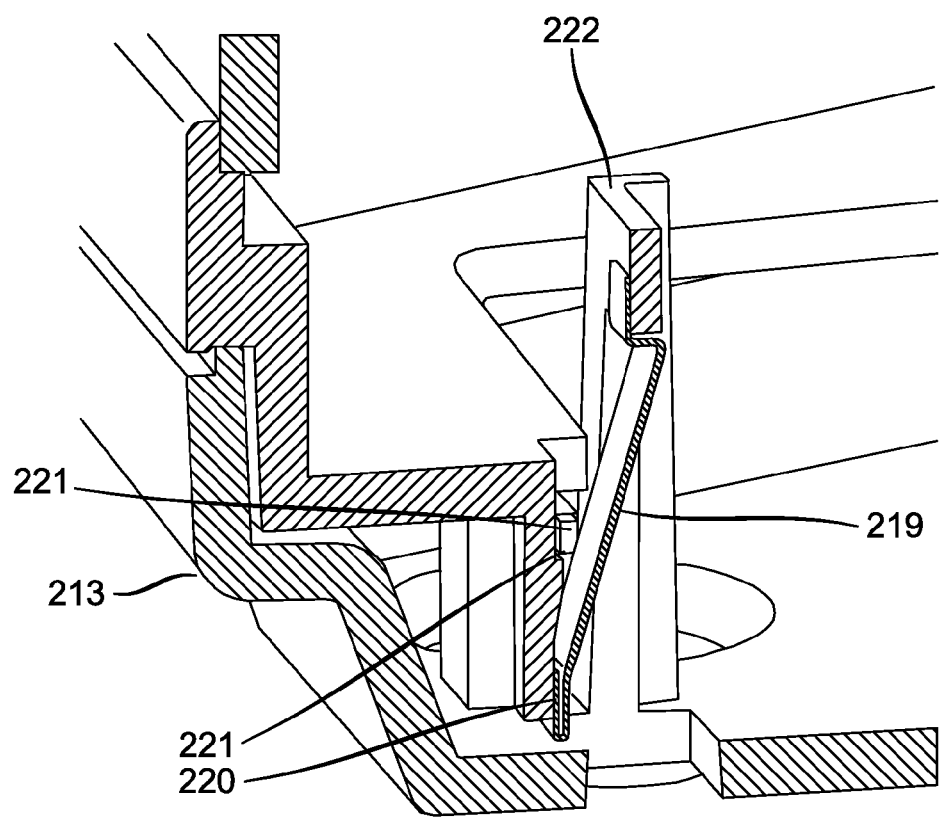

FIGS. 13-15 are various views of the metal retention clips 214. The views show that the front piece 211 and the case top back piece 212 can be attached to one another and can then be attached to the case bottom piece 213 using the metal retention clips 214. The metal retention clips 214 are retained by features on the case top front piece 211 and the case top back piece 212. The clips 214 are generally V-shaped in which there is an anchor portion 220 which is one side of the V-shape. The anchor portion 220 can have a rectangular planar shape and have an aperture 277 that fits into an anchor base 221 of the case top front piece 211 and the case top back piece 212. FIG. 15 shows how the aperture 277 of anchor portion 220 engages a protrusion 221A in the anchor base 221 such that an inward pointing ledge at the top of the anchor portion 220 grasps a top portion of the anchor base 221 and the bottom inner wedge grasps the bottom portion of the anchor base 221 to the secure the retention clip 214. This permits the locking portion 219 of the clip 214, which is the other side of the V-shape, to engage with features of the bottom piece 213 to close or assemble the electronic device 200. In particular, the top of the locking portion 219 can have a horizontal ledge that extends inwardly to contact a bottom surface of the clip engaging features 222 and the locking portion 219 can further have an upward extension at the edge of the ledge to engage an edge of the bottom surface of the feature 222 as the outward spring force of spring 214 cause the locking portion to move outward to engage the feature 222 as shown in FIG. 18. Although a V-shape is shown, a U-shape could be employed as well and both sides of the V or U-shape part can have different heights.

Figure 16:
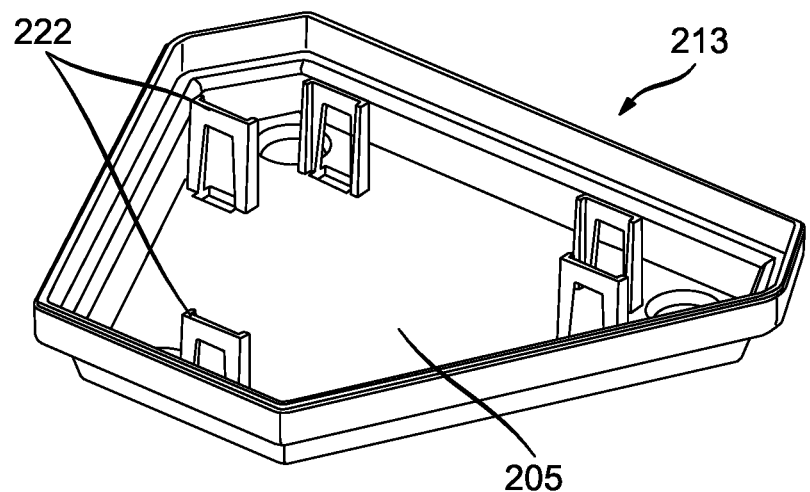
FIG. 16 is perspective views of the case bottom piece 213, in accordance with an embodiment of the present principles.

FIG. 16 is a perspective view of the case bottom piece 213 which shows the base 205 and clip engaging features 222 that extend vertically upward from the bottom piece 213. The clip engaging features 222 are designed to engage the locking portion 219 of the clips 214 on the case front 211 and the case top back piece 212. A screwless clip and spring mechanism 288 is formed from the clips 214 and clip engaging features.

Figure 17:
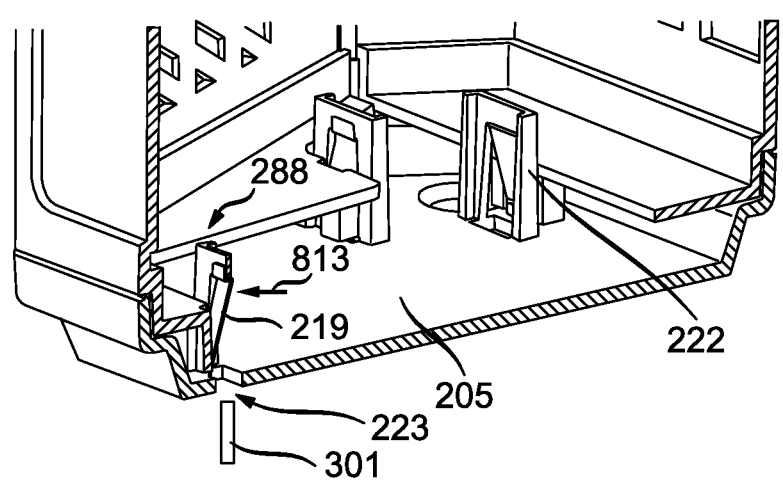
FIGS. 17 and 18 are perspective views showing how the bottom piece 213 engages the case top front piece and the case top back piece 212, in accordance with an embodiment of the present principles.

FIGS. 17 and 18 are perspective views showing how the case bottom piece 213 engages the case top front piece 211 and the case top back piece 212. Release finger 301 pushes locking portion inward to disengage the locking portion 219 as it enters aperture 223

Figure 19:
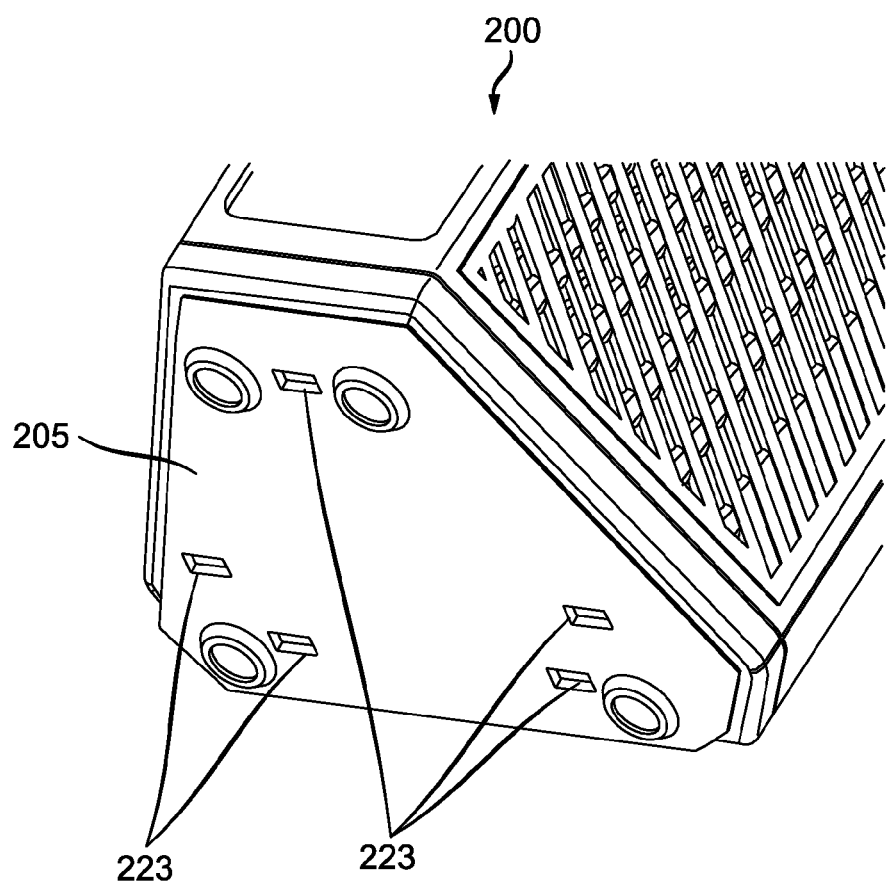
FIG. 19 is a bottom perspective view of the vertically oriented electronic device 200, in accordance with an embodiment of the present principles.

FIG. 19 is a bottom perspective view of the vertically oriented electronic device 200.

Figure 20:
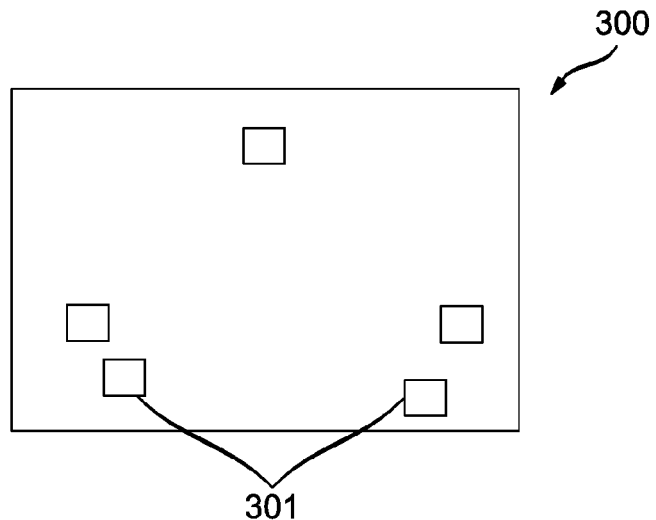
FIG. 20 is a view of the release fixture 300, in accordance with an embodiment of the present principles.

FIG. 20 is a view of a release fixture 300, in accordance with an embodiment of the present principles. FIGS. 19 and 20 show release aperture 223 in base 205 which permits a release finger 301 on a base of a release fixture 300 to enter the release aperture 223 to push the locking portion 219 inward toward the anchor portion 220 to remove the top portion of the locking portion 219 off of the engaging feature 222. This can be understood also with reference to FIG. 18 in which the release finger 301 (not shown in FIG. 301) will contact the outer edge of the locking portion 219 move the locking portion 219 away from engaging feature 222.

Figure 21:
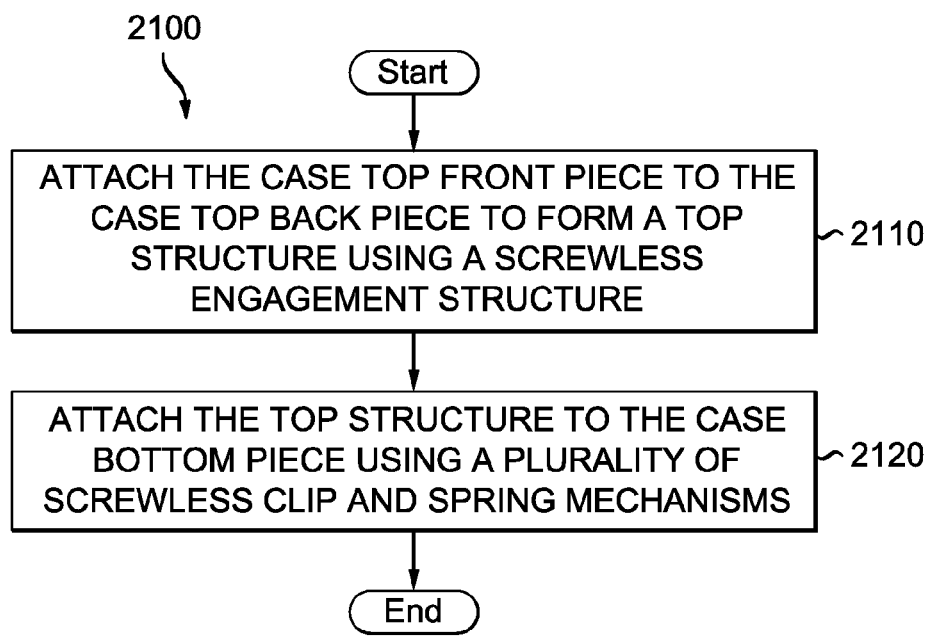
FIG. 21 is a flow diagram showing an exemplary method 2100 for assembling an electronic device having a case bottom piece, a case top front piece, and a case top back piece, in accordance with an embodiment of the present principles.

FIG. 21 is a flow diagram showing an exemplary method 2100 for assembling an electronic device having a case bottom piece, a case top front piece, and a case top back piece. At step 2110, one attaches the case top front piece 211 to the case top back piece 212 to form a top structure 210 using a screwless engagement structure 977. At step 2120, one attaches the top structure 210 to the case bottom piece 213 using a plurality of screwless clip and spring mechanisms 288.

Figure 22:
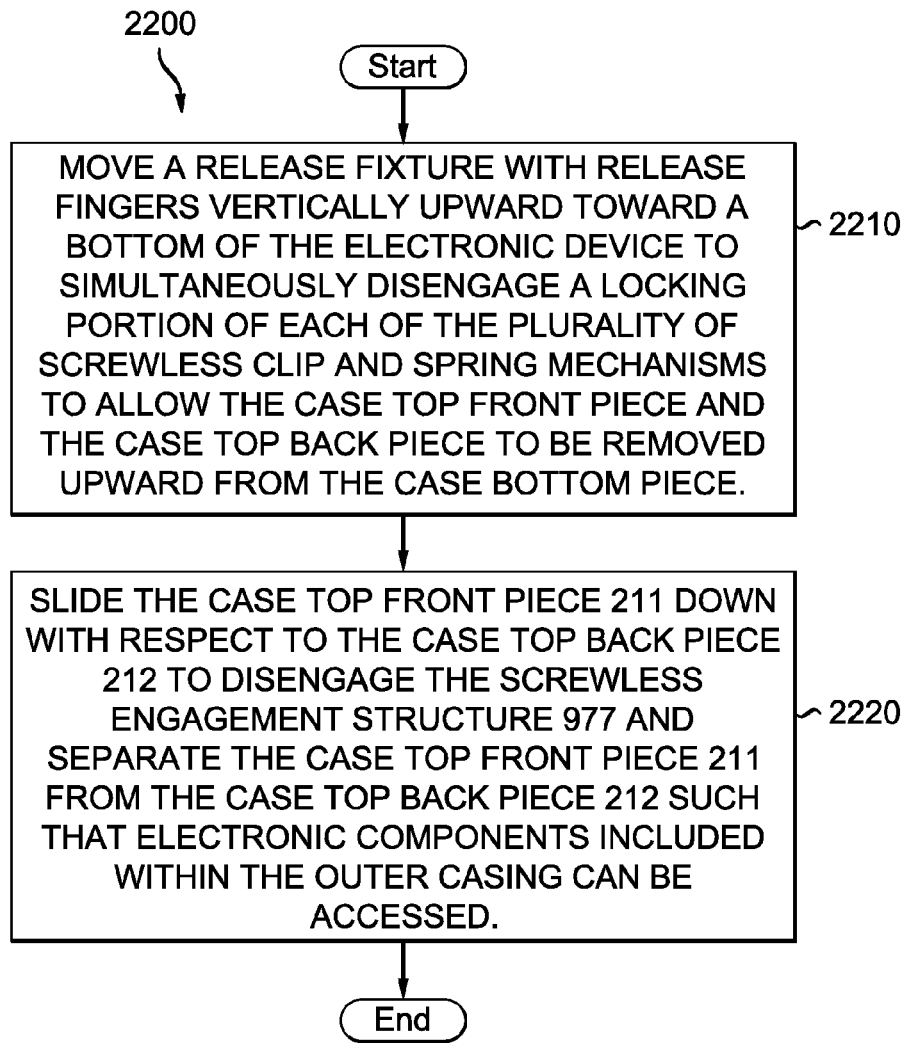
FIG. 22 is a flow diagram showing an exemplary method 2200 for disassembling an electronic device having a case bottom piece, a case top front piece, and a case top back piece, in accordance with an embodiment of the present principles.

FIG. 22 is a flow diagram showing an exemplary method 2200 for disassembling an electronic device having a case bottom piece, a case top front piece, and a case top back piece. The method 2200 is applied to an assembled condition, wherein the case top front piece is attached to the case top back piece 212 to form a top structure 210 using a screwless engagement structure 977, and the top structure is attached to the case bottom piece using a plurality of screwless clip and spring mechanisms 288. At step 2210, one moves a release fixture 300 with release fingers 301 vertically upward toward a bottom of the electronic device to simultaneously disengage a locking portion 219 of each of the plurality of screwless clip and spring mechanisms 288 to allow the case top front piece 211 and the case top back piece 212 to be removed upward from the case bottom piece 213. At step 2220, one slides the case top front piece 211 down with respect to the case top back piece 212 to disengage the screwless engagement structure 977 and separate the case top front piece 211 from the case top back piece 212 such that electronic components included within the outer casing can be accessed.

The electronic device 200 can be a set-top box or the like and can be vertically oriented such that the height of the device is higher than the width of the front vertical surface and/or the rear vertical surface and/or the lateral depth. The lateral cross section can be a quadrilateral shape in which the front and back are parallel and the side surfaces are not parallel to one another. The device can be designed such that the release fixture and release fingers move vertically upward toward the bottom of the device to simultaneously disengage the plurality of the locking portions to allow the case top front piece 211 and the case top back piece 212 to be remove upward from the case bottom piece 213. The case top front piece 211 and the case top back piece 212 can then further be detached from one another by moving the case top in a motion oppose to that shown in FIG. 5 to attach the two pieces, i.e. case top front piece 211 and case top back piece 212. With the two pieces 211 and 212 attached, the assembly can be reassembled or assembled by aligning the clip engaging features 222 with the clip 214 when the release fixture is removed or not present.

Figure 23:
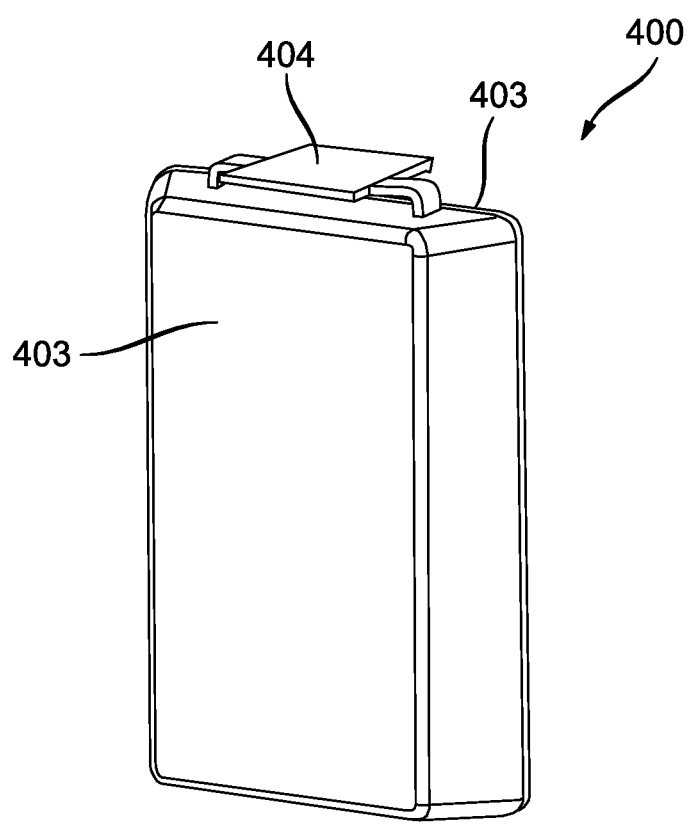
FIG. 23 is a perspective view of the modular component 400 to be attached to the vertically oriented electronic device 200, in accordance with an embodiment of the present principles.
Figure 24:
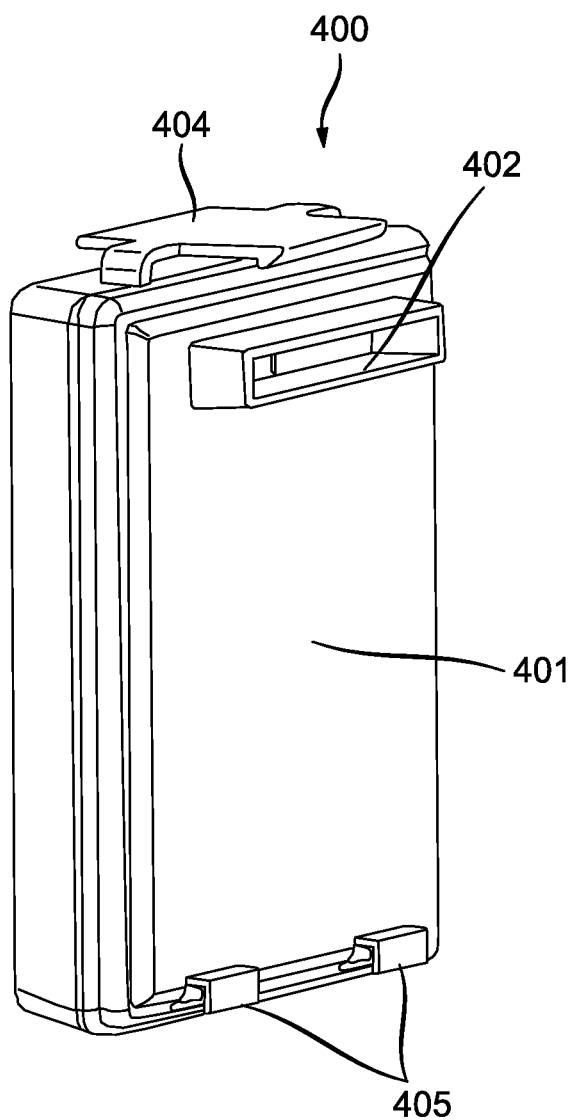
FIGS. 24-29 show various view of the modular component 400 to be attached to the vertically oriented electronic device 200, in accordance with an embodiment of the present principles.
Figure 25:
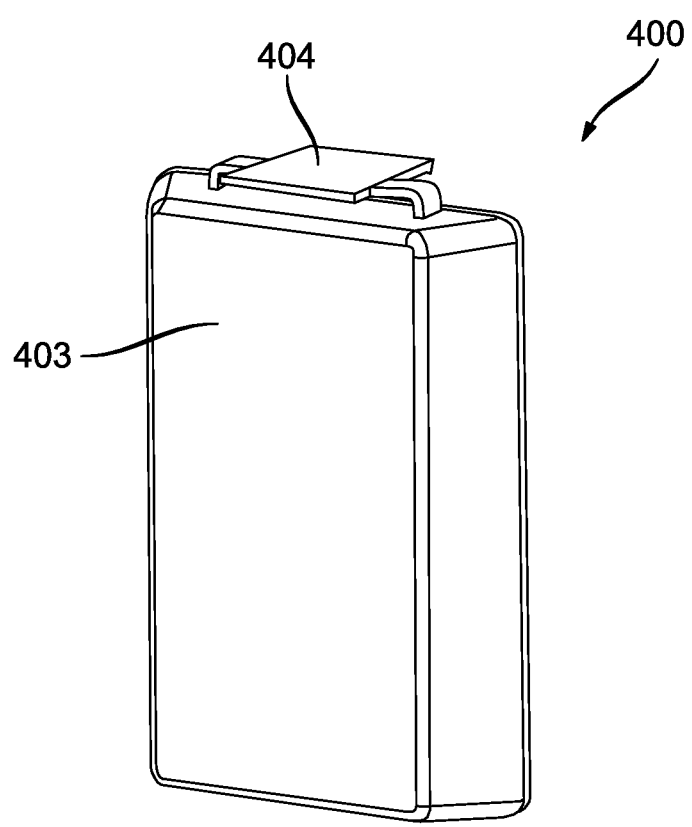
Figure 28:
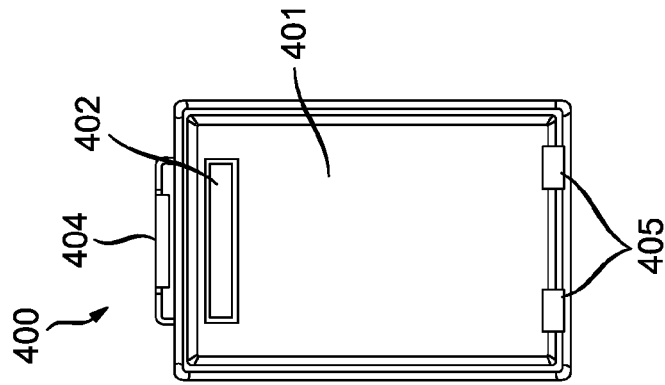
Figure 27:
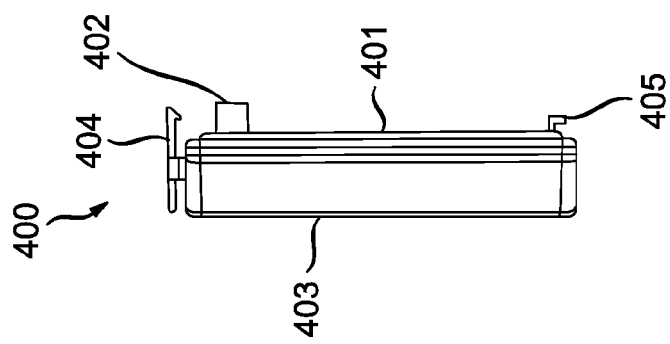
Figure 26:
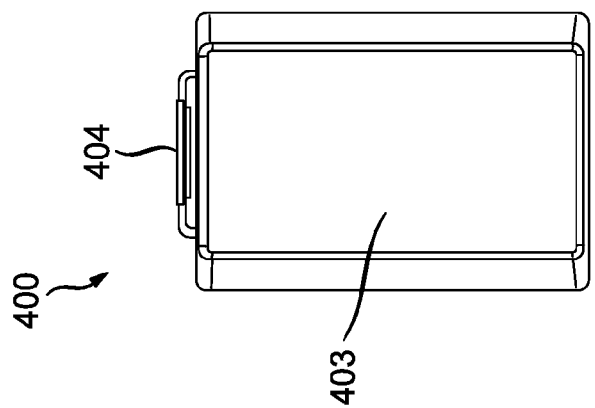

FIG. 23 is a perspective view of the modular component 400 to be attached to the vertically oriented electronic device 200 which can include additional functionalities that augment the capabilities of the electronic device 200, in accordance with an embodiment of the present principles. This view shows the front broad side 403 and latch 404 positioned at the top 405 or one end of the component 400.

FIGS. 24-29 show various views of the modular component 400 to be attached to an electronic device such as the vertically oriented electronic device 200 in which the back broad side 401 is the connection side and includes an electronic connector 402 that will permit electronic signals and/or power to be transmitted between the electronic device and the modular component 400, in accordance with an embodiment of the present principles. These views further show that the modular component 400 has at least one mechanical connector 405 positioned near, at, or toward the bottom edge of the modular component 400.

Figure 29:
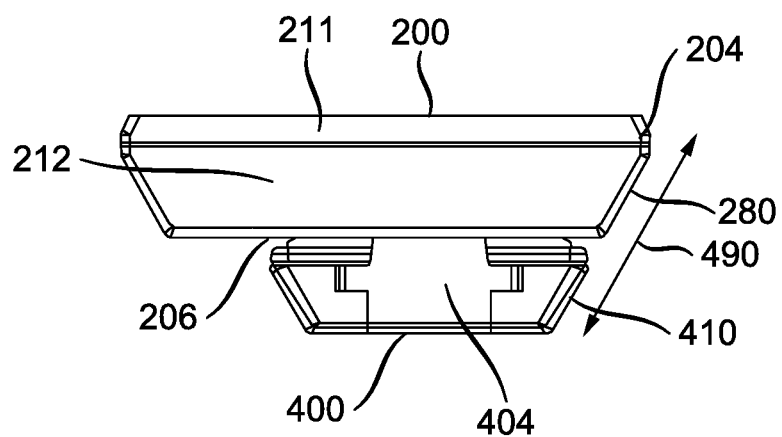
Figure 30:
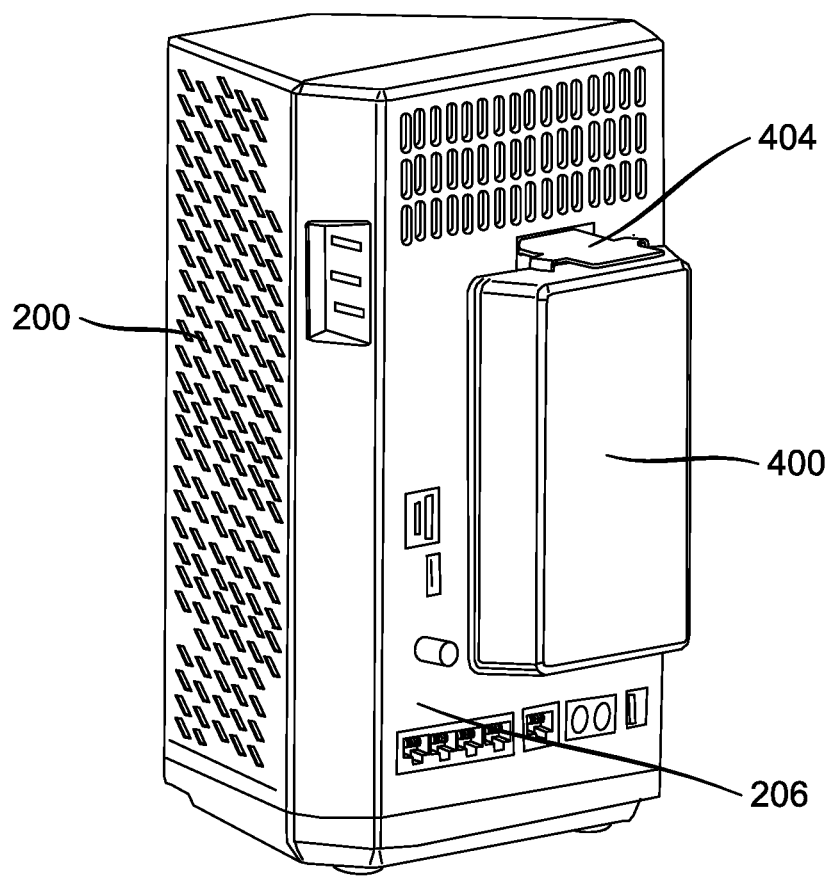
Figure 31:
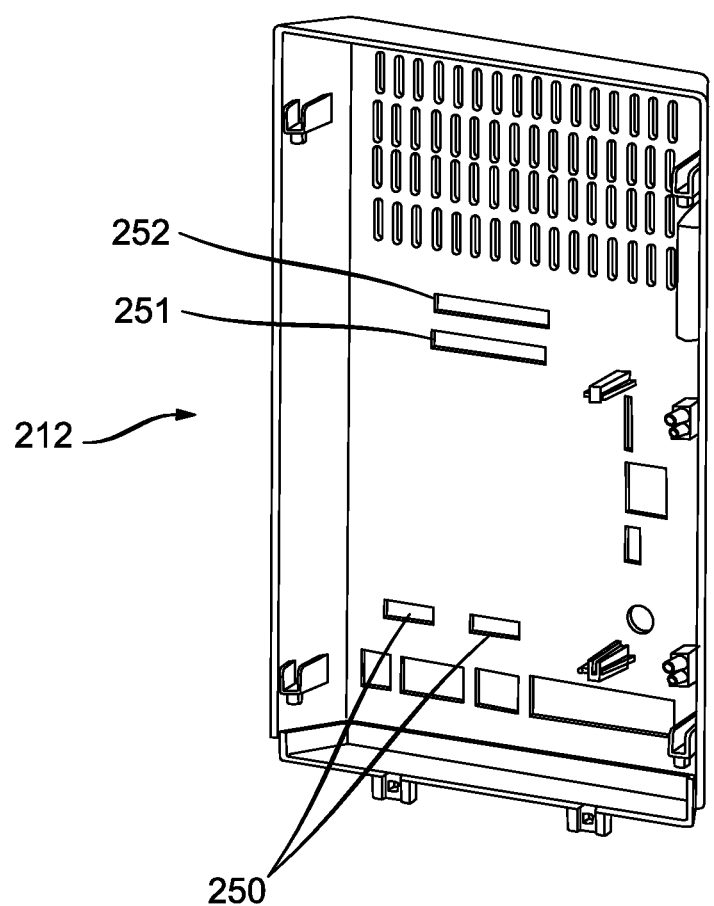

FIG. 29 in particular shows a partial top plan view of the modular component 400 attached to the electronic device 200. In this view, the modular component 400 is configured such that the top plan view of the modular component 400 can have a quadrilateral shape in which one of the vertical side walls 410 is align with, is parallel to and/or collinear with a rear portion 280 of the side walls 204 at the back wall 206. The rear portion can be part of the case top back piece 212. The case top back piece 212 can be connected to the case top front piece 211. FIG. 29 shows that the direction 490 of the vertical side wall 410 can be the same as the rear portion 280 of the side walls 204. In such an arrangement, the modular component 400 is advantageously not visible to a viewer facing the front of the electronic device 200. Such a configuration also ensures that the modular component does not protrude outward from a line that follows the direction of the rear portion 280, which is advantageous for additional reasons which include making it easier to connect the modular component 400, because the vertical side wall 410 and rear portion 280 can behave as alignment gauges or features. Also, the modular component will be less likely to catch or bump into objects when the electronic device is moved forward and backward. Additionally, the modular component will not interfere with positioning the electronic device in a catercorner arrangement. In this arrangement shown in FIG. 29, the angles of the vertical side wall 410 and the rear portion 280 of the side walls 204 can be an acute angle or angles with respect to the front broad side 403 and the front wall 208, respectively.

Figure 32:
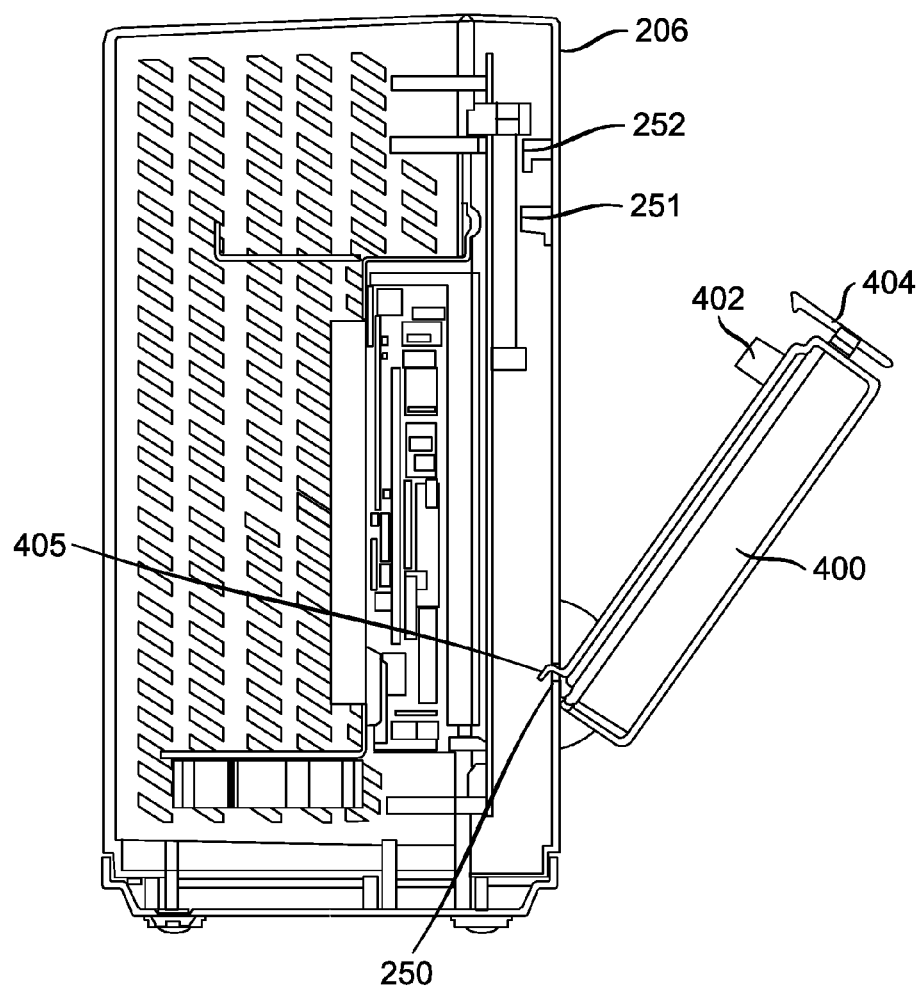

FIGS. 30-34 show various other views of the modular component 400 to be attached to the vertically oriented electronic device 200, wherein the mechanical connection features are included, in accordance with an embodiment of the present principles. The back broad side 401 which is intended to face the rear back wall 206 of the electronic device 200 includes an electronic connector 402 and mechanical connectors 405. The mechanical connector 405, by being a visible protrusion, permits the user to align the connector 405. The connector or connectors 405 can be hooks or L-shaped structures with a corresponding mechanical connector aperture 250 on the rear wall 206 of the device 200. These connectors are also referred to as hooks 405. The user can then place a portion of the connector 405 into aperture 250 to create a hinge mechanism. The connector can be a hook or a downward pointing portion of an L-shaped structure that catches connector aperture 250 which is shown in FIG. 32. The user can then swing the modular component 400 in an upward arcing motion such that the electronic connector 402 connects with electronic jack opening 251 on a rear wall 206 and the latch 404 engages latch catch 252 which is positioned above the electronic jack opening 251 as shown in FIG. 33. The latch 404 can be a hinge mechanism in which the latch includes a horizontal planar portion that is connected to a hinge 496 in a central portion of the planar portion. The planar portion has a leading edge directed toward the back broad side 401 and the leading edge has an acute angle end that has an angled portion 499 that slopes down and back toward the back broad side 401. The angled portion 499 contacts the bottom receiving edge of the latch catch 252 to permit the planar portion to elastically rotate upward to permit the leading edge 494 to slide into the latch catch. The angled portion 499 extends downward to the extent that an interior right angle contact edge 498 is formed with the bottom surface of the planar portion. As the modular component 400 is fully engaged, the interior right angle contact edge 498 grasps a corresponding interior edge of the catch 252 in the back broad side 401 to securely hold the modular component 400 to the rear wall 206. To disconnect the component 400, the trailing portion 495 of the horizontal planar portion that extends from the hinge 496 toward the front broad side 403 is pressed downward to cause the interior right angle contact edge 498 of latch 404 to move upward about the hinge 496 and clear the interior edge of the catch 252, whereby the modular component 400 can then be rotated or swung outward about the pivot point created by the connector 405 in the aperture 250.

As noted above, the electronic device 200 can be a quadrilateral generally in which the front and back are parallel and the side surfaces are not parallel to one another. However, the general quadrilateral shape can include some additional vertical connecting surfaces to make at least two additional minor surfaces such as the rear portions 280. These rear portions 280 can be part of the side wall 204 and be between the side wall 204 portion associated with the case top front piece 211 and rear wall 206. The rear portions 280 can be substantially smaller vertical surfaces than the side wall 206 portion associated with case top front piece 211.

Further, provided is the concept of a modular component 400 that can be generally attached to the back of any electronic device according the attachment and detachment mechanism disclosed. Preferably, the novel modular component is attached to the vertically oriented electronic device 200 which has the at least three piece construction disclosed herein in which the modular component is attached to one of the vertical surfaces. Preferably, the attachment is to a back surface such that the component 400 is out of the line of the sight of the user who is facing the front of the electronic device. To avoid being visible, one vertical side wall 410 of the component is aligned to be parallel and/or collinear with one of the vertical side walls 260 of the device 200.

Figure 35:
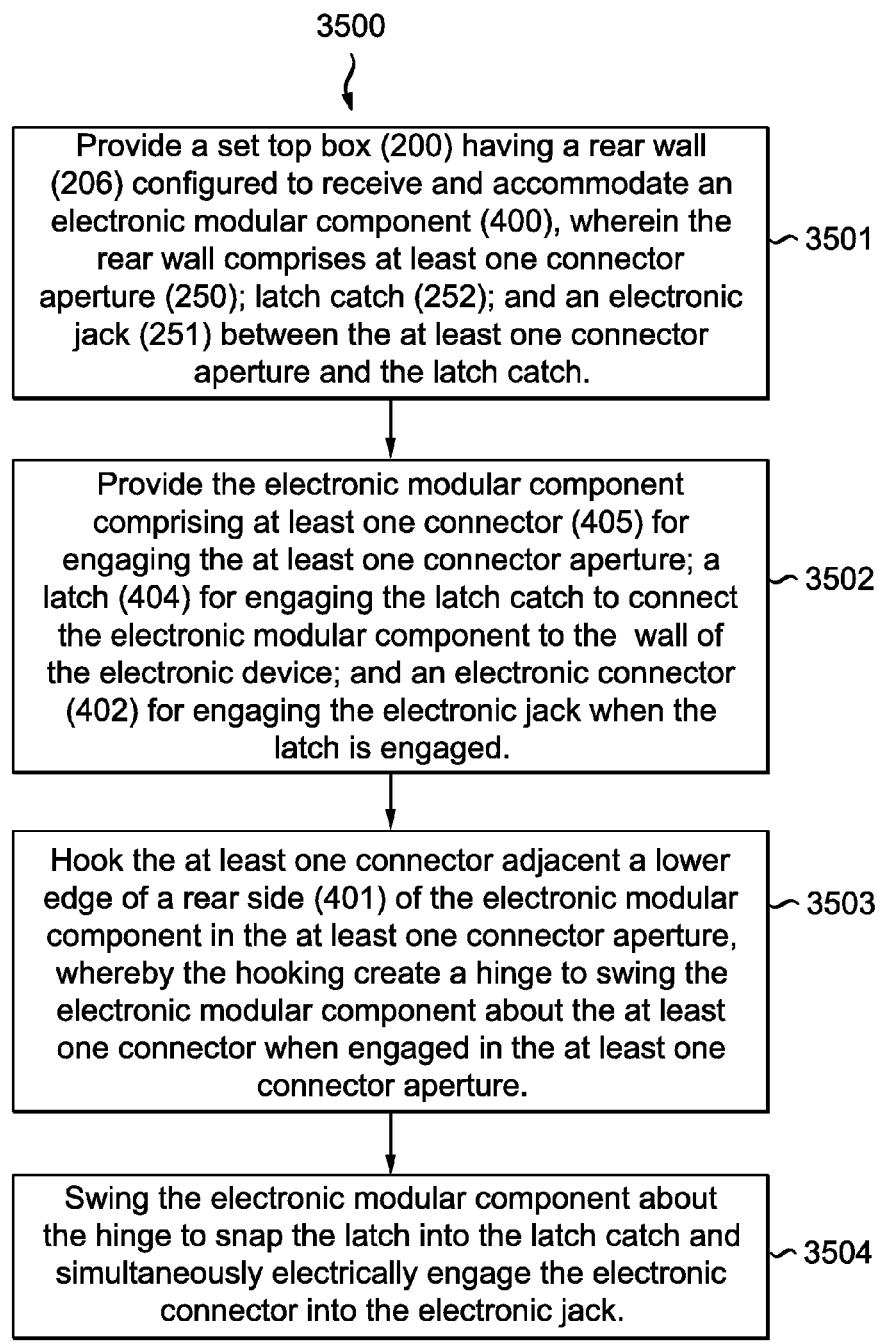
FIG. 35 is a flow diagram showing an exemplary method 3500 for installing the electronic modular component 400 on the electronic device 200, in accordance with an embodiment of the present principles.

FIG. 35 is a flow diagram showing an exemplary method 3500 for installing the electronic modular component 400 on the electronic device 200, in which in step 3501, a set top box (200) is provided having a rear wall (206) configured to receive and accommodate an electronic modular component (400), wherein the rear wall comprises at least one connector aperture (250); latch catch (252); and an electronic jack (251) between the at least one connector aperture and the latch catch. In step 3502, the electronic modular component is provided that comprises at least one connector (405) for engaging the at least one connector aperture; a latch (404) for engaging the latch catch to connect the electronic modular component to the wall of the electronic device; and an electronic connector (402) for engaging the electronic jack when the latch is engaged. In step 3503, the at least one connector that is adjacent a lower edge of a rear side (401) of the electronic modular component is hooked in the at least one connector aperture, whereby the hooking create a hinge to swing the electronic modular component about the at least one connector when the at least one connector is engaged in the at least one connector aperture. In step 3504, the electronic modular component is swung about the hinge to snap the latch into the latch catch and simultaneously electrically engage the electronic connector into the electronic jack.

All examples and conditional language recited herein are intended for pedagogical purposes to aid the reader in understanding the present principles and the concepts contributed by the inventor to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Reference in the specification to "an embodiment" of the present principles, as well as other variations thereof, means that a particular feature, structure, characteristic, and so forth described in connection with the embodiment is included in at least one embodiment of the present principles. Thus, the appearances of the phrase "in an embodiment", as well any other variations, appearing in various places throughout the specification are not necessarily all referring to the same embodiment.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope of the present principles. All such changes and modifications are intended to be included within the scope of the present principles as set forth in the appended claims.

Also, it is intended that the expressions "rear wall" and "front wall" and the expressions "vertical" and "horizontal,"

as well as other complementary terms are intended to be construed from the perspective of the observer of the figures; and as such, these expression can be interchanged depending upon the direction that observer looks at the device.

The invention claimed is:

1. An electronic device system comprising:
an electronic device having an outer casing, wherein the outer casing has a height that is higher than a width of front vertical surface of the outer casing, a width of a wall which forms a rear vertical surface of the outer casing, and a lateral depth of the outer casing; and
an electronic modular component connected to the wall;
wherein the wall comprises:
at least one connector aperture;
a latch catch; and
an electronic jack between the at least one connector aperture and the latch catch, the latch catch positioned above the electronic jack; and
wherein the modular component comprises:
at least one connector that engages the at least one connector aperture;
a latch that engages the latch catch to connect the electronic modular component to the wall of the electronic device;
an electronic connector that engages the electronic jack when the latch is engaged;
wherein the latch is positioned adjacent an upper edge of a side of the electronic modular component, the latch comprises a planar portion perpendicular to the side and extending away from the side, and the planar portion having a leading edge having a protruding angled portion which grasps the latch catch, thereby causing the latch to engage the latch catch.

2. The electronic device system of claim 1, wherein the at least one connector is a hook positioned adjacent a lower edge of the side of the electronic modular component, the hook creating a hinge when engaged in the at least one connector aperture.

3. The electronic device system of claim 1, wherein the latch comprises a latch hinge to which the planar portion is connected, the latch hinge being attached to the electronic modular component and the latch hinge permits the planar portion to rotate about an attachment point such that when an exterior angled portion of the protruding angled portion contacts an exterior region of the latch catch of the electronic device and is pushed toward the electronic device, the exterior angled portion causes the leading edge of the planar portion to rotate to an extent where the leading edge is laterally positioned so the leading edge and the protruding angled portion enters the latch catch, whereby the planar portion elastically laterally repositions once the leading edge and the protruding angled portion are in the latch catch to cause an interior contact edge opposite the exterior angled portion to grasp an interior edge of the latch catch.

4. The electronic device system of claim 1, wherein the electronic device comprises a wall portion connected to the wall, the wall portion forms an obtuse angle with the wall; and
wherein the electronic modular component comprises a side facing the wall of the electronic device and a side wall parallel to the wall portion.

5. The electronic device system of claim 1, wherein the planar portion of the latch comprises:
a trailing portion opposite the leading edge, the trailing portion being configured to disengage the protruding angled portion from the latch catch when the trailing portion is pressed to enable the electronic modular component to be detached from the electronic device.

6. An electronic modular component comprising:
a back broad side;
at least one connector on the back broad side adjacent one edge of the back broad side, the at least one connector configured to engage at least one connector aperture of an electronic device;
a latch positioned at an opposite edge of the back broad side, the latch configured to engage a latch catch;
an electronic connector between the latch and the at least one connector on the back broad side, the electronic connector configured to engage an electronic jack when the latch is engaged, the latch catch positioned above the electronic jack;
wherein the latch comprises:
a latch hinge positioned at an end of the electronic modular component;
a planar portion connected to the latch hinge, the planar portion extending beyond the lateral position of the back broad side; and
a leading edge at one end of the planar portion having an interior contact edge extending from the planar portion at an angle from planar portion, the interior contact edge being configured to grasp an interior edge of the latch catch of the electronic device.

7. The electronic modular component of claim 6, wherein the electronic modular component has a top plan view quadrilateral shape in which the back broad side is parallel to a front broad side and two vertical side walls extend between the front and back broad sides, the back broad side having a smaller lateral width than the lateral width of the front broad side.

8. The electronic modular component of claim 6, wherein the planar portion of the latch comprises:
a trailing portion opposite the leading edge, the trailing portion being configured to disengage the interior contact edge from the latch catch when the trailing portion is pressed.

9. The electronic modular component of claim 6, wherein the at least one connector is a hook positioned at the one edge and is configured to create a hinge when engaged in the at least one connector aperture of the electronic device.

* * * * *